US012756402B2

(12) United States Patent
Yang et al.

(10) Patent No.: US 12,756,402 B2
(45) Date of Patent: Oct. 6, 2026

(54) DIGITAL-TO-ANALOG CONVERTER, CHIP, AND ELECTRONIC DEVICE

(71) Applicant: SG MICRO CORP, Beijing (CN)

(72) Inventors: Yang Yang, Beijing (CN); Xuecheng Man, Beijing (CN)

(73) Assignee: SG MICRO CORP, Beijing (CN)

( * ) Notice: Subject to any disclaimer, the term of this patent is extended or adjusted under 35 U.S.C. 154(b) by 123 days.

(21) Appl. No.: 18/879,832

(22) PCT Filed: Jun. 30, 2023

(86) PCT No.: PCT/CN2023/105220

§ 371 (c)(1),
(2) Date: Dec. 30, 2024

(87) PCT Pub. No.: WO2024/119808

PCT Pub. Date: Jun. 13, 2024

(65) Prior Publication Data

US 2026/0005703 A1 Jan. 1, 2026

(30) Foreign Application Priority Data

Dec. 9, 2022 (CN) ........................ 202211582929.0

(51) Int. Cl.
*H03M 1/78* (2006.01)
*H03F 3/45* (2006.01)
(Continued)

(52) U.S. Cl.
CPC ........ *H03M 1/785* (2013.01); *H03F 3/45475* (2013.01); *H03F 1/26* (2013.01); *H03F 3/183* (2013.01); *H03F 3/68* (2013.01)

(58) Field of Classification Search
CPC .... H03M 1/785; H03F 3/45475; H03F 3/183; H03F 3/68; H03F 1/26
See application file for complete search history.

(56) References Cited

U.S. PATENT DOCUMENTS 9,214,950 B1 12/2015 Davis et al.
2019/0149105 A1* 5/2019 Hadiashar ........... H03F 3/45941 330/258

FOREIGN PATENT DOCUMENTS

CN 105204563 A 12/2015
CN 112187261 A 1/2021
(Continued)

OTHER PUBLICATIONS

Shi Rong, et al., The New Technique for the Digital Image Compression Based on the Information Redundancy among Image Blocks, 2003, pp. 375-376, vol. 8.

*Primary Examiner* — Joseph J Lauture
(74) *Attorney, Agent, or Firm* — Bayramoglu Law Offices LLC

(57) ABSTRACT

A digital-to-analog converter includes a sampling resistor network circuit, an operational amplifier, a feedback resistor, and a compensation current generation circuit. The sampling resistor network circuit controls a sampling resistance value of the sampling resistor network circuit based on a sampling codeword, and generates an output current based on a voltage difference between a first reference voltage and a voltage at a first input terminal of the operational amplifier as well as the sampling resistance value. The compensation current generation circuit generates a compensation current based on the sampling codeword. The compensation current is used to compensate for an offset current generated by an offset voltage in the sampling resistor network circuit in order to make a sum of the compensation current and the offset current equal to a first constant. The first constant is independent of the sampling codeword.

20 Claims, 6 Drawing Sheets

(51) Int. Cl.

| | |
|---|---|
| *H03F 1/26* | (2006.01) |
| *H03F 3/183* | (2006.01) |
| *H03F 3/68* | (2006.01) |

(56) References Cited

FOREIGN PATENT DOCUMENTS

| | | | |
|---|---|---|---|
| CN | 114123986 | A | 3/2022 |
| CN | 115833841 | A | 3/2023 |
| JP | 2015021881 | A | 2/2015 |

* cited by examiner

DIGITAL-TO-ANALOG CONVERTER, CHIP, AND ELECTRONIC DEVICE

CROSS REFERENCE TO THE RELATED APPLICATIONS

This application is the national phase entry of International Application No. PCT/CN2023/105220, filed on Jun. 30, 2023, which is based upon and claims priority to Chinese Patent Application No. 202211582929.0, filed on Dec. 9, 2022, the entire contents of which are incorporated herein by reference.

TECHNICAL FIELD

The embodiments of the present disclosure relate to a field of integrated circuit technology, in particular to a digital-to-analog converter, a chip, and an electronic device.

BACKGROUND

Digital-to-analog converters (DACs) are widely used in various integrated circuits. The working principle of a DAC composed of an R-2R trapezoidal resistance network in current mode (sometimes referred to as MDAC) is to convert the binary-weighted current generated by the R-2R trapezoidal network into an output voltage through an operational amplifier. One drawback of this DAC structure is that an input offset voltage of the operational amplifier can affect the output voltage, resulting in an introduction of nonlinear errors into the output voltage.

SUMMARY

Embodiments of the present disclosure provide a digital-to-analog converter, a chip, and an electronic device.

A first aspect of the present disclosure provides a digital-to-analog converter. The digital-to-analog converter includes a sampling resistor network circuit, an operational amplifier, a feedback resistor, and a compensation current generation circuit. The sampling resistor network circuit is configured to control a sampling resistance value of the sampling resistor network circuit based on a sampling codeword, and generate an output current based on a voltage difference between a first reference voltage from a first reference voltage terminal and a voltage at a first input terminal of the operational amplifier as well as the sampling resistance value. A first end of the feedback resistor is coupled to the first input terminal of the operational amplifier. A second end of the feedback resistor is coupled to an output terminal of the operational amplifier and a sampling voltage output terminal. The compensation current generation circuit is configured to generate a compensation current based on the sampling codeword. The compensation current is used to compensate for an offset current generated by an offset voltage in the sampling resistor network circuit in order to make a sum of the compensation current and the offset current equal to a first constant. The first constant is independent of the sampling codeword. The offset voltage exists between a second input terminal and the first input terminal of the operational amplifier.

In some embodiments of the present disclosure, the compensation current generation circuit includes a compensation resistor network circuit. The compensation resistor network circuit is configured to generate a compensation codeword based on the sampling codeword, control a compensation resistance value of the compensation resistor network circuit based on the compensation codeword, and generate the compensation current based on a voltage difference between the voltage at the first input terminal of the operational amplifier and a second voltage from a second voltage terminal as well as the compensation resistance value.

In some embodiments of the present disclosure, the compensation resistor network circuit includes: a compensation codeword generation circuit, K compensation resistors, and K voltage-controlled switches. The compensation codeword generation circuit is configured to generate a compensation codeword based on the sampling codeword. The compensation codeword has K bits. Each bit of the compensation code is used to control a controlled terminal of a corresponding voltage-controlled switch of the K voltage-controlled switches. Each of the K voltage-controlled switches is connected in series with a corresponding compensation resistor of the K compensation resistors to form a resistor-switch group. The first end of each resistor-switch group is coupled to the first input terminal of the operational amplifier. A second end of each resistor-switch group is coupled to a second voltage terminal. The values of resistances of the K compensation resistors are set as a geometric series. A sum of an equivalent conductance of the compensation resistor network circuit and the equivalent conductance of the sampling resistor network circuit is equal to a second constant. K is an integer greater than 1.

In some embodiments of the present disclosure, the second constant is equal to an integer value rounded up from the equivalent conductance of the sampling resistor network circuit.

In some embodiments of the present disclosure, K=7.

In some embodiments of the present disclosure, the compensation current generation circuit includes a current source network circuit. The current source network circuit is configured to generate a compensation codeword based on the sampling codeword, and generate the compensation current based on the compensation codeword. The current source network circuit includes: a compensation codeword generation circuit, K compensation current sources, and K voltage-controlled switches. The compensation codeword generation circuit is configured to generate the compensation codeword based on the sampling codeword. The compensation codeword has K bits. Each bit of the compensation code is used to control a controlled terminal of a corresponding voltage-controlled switch of the K voltage-controlled switches. Each of the K voltage-controlled switches is connected in series with a corresponding compensation current source of the K compensation current sources to form a current source-switch group. A first end of each current source-switch group is coupled to the first input terminal of the operational amplifier. A second end of each current source-switch group is coupled to a second voltage terminal. Values of currents outputted from the K compensation current sources are set as a geometric series. K is an integer greater than 1.

In some embodiments of the present disclosure, the digital-to-analog converter further includes a zero-adjusting resistor. A first end of the zero-adjusting resistor is coupled to the first input terminal of the operational amplifier. A second end of the zero-adjusting resistor is coupled to a second reference voltage terminal. A second reference voltage outputted from the second reference voltage terminal is an inverted voltage of the first reference voltage.

In some embodiments of the present disclosure, the sampling codeword includes N+1 bits. The sampling resistor network circuit includes N first resistors, N+1 second resistors, and N+1 single-pole double-throw switches. The N first resistors are sequentially connected in series. A first end of one of the N first resistors is coupled to the first reference voltage terminal. The first end of any of the other first resistors is coupled to a second end of a previous first resistor. Each second resistor of the N+1 second resistors and a corresponding single-pole double-throw switch of the N+1 single-pole double-throw switch form a second resistor-switch group. A first end of each second resistor-switch group is coupled to a second end of a corresponding first resistor. A second end of each second resistor-switch group is grounded. A third end of each second resistor-switch group is coupled to the first input terminal of the operational amplifier. Conduction states of N+1 single-pole double-throw switches are controlled by the sampling codeword. N is an integer greater than 1.

In some embodiments of the present disclosure, a resistance value of the second resistor is twice that of the first resistor.

In some embodiments of the present disclosure, the first input terminal of the operational amplifier is an inverting input terminal. The second input terminal of the operational amplifier is a non-inverting input terminal. A sign of the first reference voltage is opposite to that of a sampling voltage outputted from the sampling voltage output terminal.

A second aspect of the present disclosure provides a chip. The chip includes the digital-to-analog converter according to the first aspect of the present disclosure.

A third aspect of the present disclosure provides an electronic device. The electronic device includes the chip according to the second aspect of the present disclosure.

BRIEF DESCRIPTION OF THE DRAWINGS

To describe technical solutions of the embodiments of the present disclosure more clearly, the accompanying drawings of the embodiments will be briefly introduced in the following. It should be known that the accompanying drawings in the following description merely involve some embodiments of the present disclosure, but do not limit the present disclosure, in which.

Figure 1:
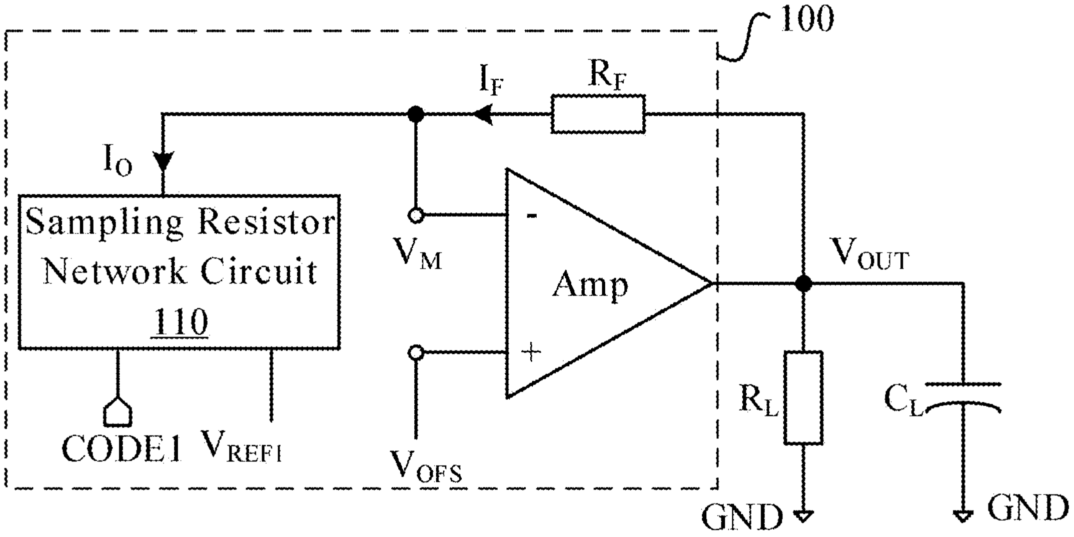
FIG. 1 is a schematic block diagram of a digital-to-analog converter.

It should be noted that the elements in the drawings are schematic and not drawn to scale.

DETAILED DESCRIPTION OF THE EMBODIMENTS

To make the technical solutions and advantages of the embodiments of the present disclosure clearer, the technical solutions in the embodiments of the present disclosure will be described clearly and completely below, in conjunction with the accompanying drawings in the embodiments of the present disclosure. Obviously, the described embodiments are merely some but not all of the embodiments of the present disclosure. All other embodiments obtained by those skilled in the art based on the described embodiments of the present disclosure without creative efforts shall fall within the protecting scope of the present disclosure.

Unless otherwise defined, all terms (including technical and scientific terms) used herein have the same meaning as commonly understood by those skilled in the art to which present disclosure belongs. It will be further understood that terms, such as those defined in commonly used dictionaries, should be interpreted as having a meaning that is consistent with their meaning in the context of the specification and will not be interpreted in an idealized or overly formal sense unless expressly so defined herein. As used herein, the description of "connecting" or "coupling" two or more parts together should refer to the parts being directly combined together or being combined via one or more intermediate components.

In all the embodiments of the present disclosure, a source and a drain of a Metal-Oxide-Semiconductor Field-Effect Transistor (MOS transistor) are symmetrical, and a current from the source to the drain to turn on an N-type transistor is in an opposite direction with respect to the current from the source to the drain to turn on a P-type transistor. Therefore, in the embodiments of the present disclosure, a controlled intermediate terminal of the transistor is referred to as a control electrode, and the remaining two terminals are referred to as a first electrode and a second electrode. In addition, terms such as "first" and "second" are only used to distinguish one element (or a part of the element) from another element (or another part of this element).

FIG. 1 shows a schematic block diagram of a digital-to-analog converter 100. The digital-to-analog converter 100 includes a sampling resistor network circuit 110, an operational amplifier Amp, and a feedback resistor RF. The sampling resistor network circuit 110 is configured to control a sampling resistance value of the sampling resistor network circuit 110 based on a sampling codeword CODE1, and generate an output current IO based on a voltage difference between a first reference voltage VREF1 from a first reference voltage terminal and the voltage VM at the backward input terminal (also known as the inverting input terminal) of the operational amplifier Amp as well as the sampling resistance value. The output current IO is equal to a result of the voltage difference between the first reference voltage VREF1 and the voltage VM divided by the sampling resistance value. The output current IO is equal to a feedback current IF flowing through the feedback resistor RF. The output current IO is converted into a sampling voltage VOUT through the operational amplifier Amp.

In an ideal scenario, the voltages at both input terminals of the operational amplifier Amp should be 0 V. In practical circuits, since an offset voltage VOFS exists between the two input terminals of the operational amplifier Amp, the voltage at the backward input terminal is often not 0 V. In FIG. 1, the offset voltage VOFS is shown at the forward input terminal (or non-inverting input terminal) of the operational amplifier Amp, and the voltage at the backward input of the operational amplifier Amp is represented by VM.

A first end of the feedback resistor RF is coupled to the backward input terminal of the operational amplifier Amp. A second end of the feedback resistor RF is coupled to the output terminal of the operational amplifier Amp and a sampling voltage output terminal. A sampling voltage VOUT generated by the digital-to-analog converter 100 is outputted from the sampling voltage output terminal. In FIG. 1, a load resistor RL and a load capacitor CL are also shown. The load resistor RL and the load capacitor CL are coupled to the sampling voltage output terminal and a ground terminal GND.

A sign of the first reference voltage VREF1 is opposite to that of the sampling voltage VOUT outputted from the sampling voltage output terminal. In an example, the first reference voltage VREF1 can be negative, while the sampling voltage VOUT can be positive.

Figure 2:
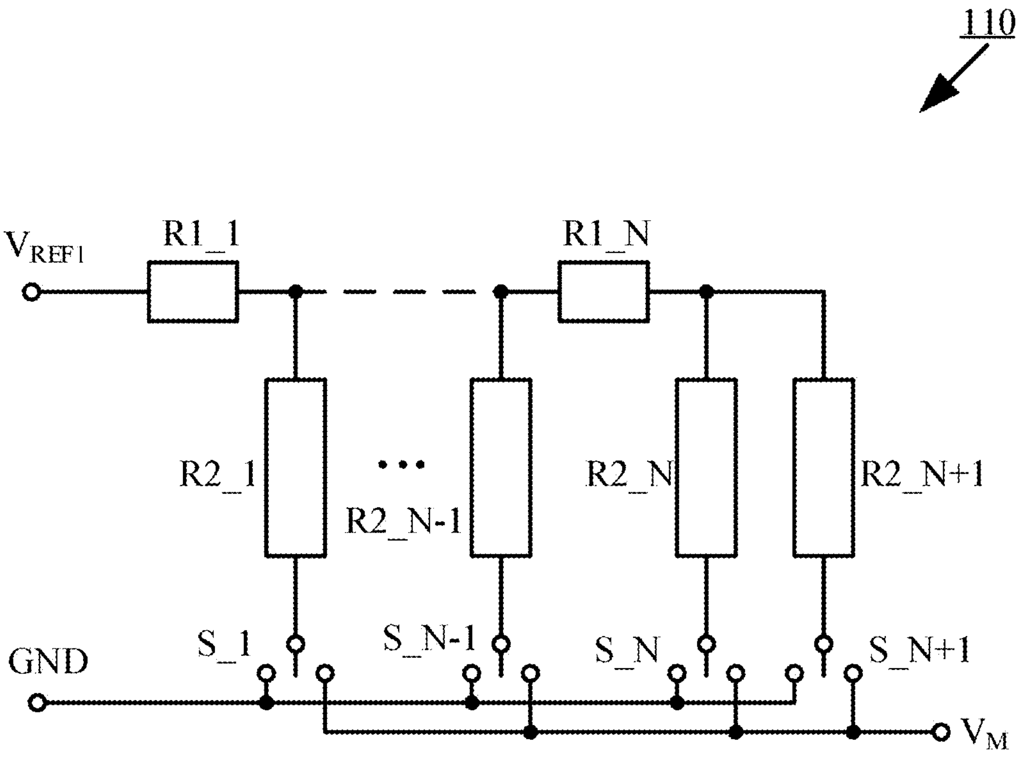
FIG. 2 is an exemplary circuit diagram of a sampling resistor network circuit in the digital-to-analog converter as shown in FIG. 1.

FIG. 2 shows an exemplary circuit diagram of the sampling resistor network circuit 110 of the digital-to-analog converter 100 shown in FIG. 1. The sampling resistor network circuit 110 may include: N first resistors R1_1, . . . , R1_N, N+1 second resistors R2_1, . . . , R2_N−1, R2_N, R2_N+1, as well as N+1 single-pole double-throw switches S_1, . . . , S_N−1, S_N, S_N+1. Each single-pole double-throw switch S_1, . . . , S_N−1, S_N, S_N+1 includes two contacts and a control terminal. Conduction states of single-pole double-throw switches S_1, . . . , S_N−1, S_N, S_N+1 is controlled by the sampling codeword CODE1. The sampling codeword CODE1 includes N+1 bits. N is an integer greater than 1.

N first resistors R1_1, . . . , R1_N are sequentially connected in series. A first end of one first resistor R1_1 of the N first resistors R1_1, . . . , R1_N is coupled to a first reference voltage terminal VREF1. The first end of the other first resistor R1_N is coupled to a second end of a previous first resistor. Each second resistor of N+1 second resistors R2_1, . . . , R2_N−1, R2_N, R2_N+1, along with a corresponding single-pole double-throw switch of N+1 single-pole double-throw switches S_1, . . . , S_N−1, S_N, and S_N+1, forms a second resistor-switch group. For example, the first second resistor R2_1 and the first single-pole double-throw switch S_1 form the first second resistor-switch group. The Nth second resistor R2_N and the Nth single-pole double-throw switch S_N form the Nth second resistor-switch group. The first end of each second resistor-switch group is coupled to the second end of the corresponding first resistor. For example, the first end of the first second resistor-the switch group (i.e., the first end (upper end) of the first second resistor R2_1) is coupled to the second end (right end) of the first first resistor R1_1. The first end of the Nth second resistor-switch group (i.e., the first end (upper end) of the Nth second resistor R2_N) is coupled to the second end (right end) of the Nth first resistor R1_N. Specifically, the first end of the (N+1)th second resistor-switch group is coupled to the second end (right end) of the Nth first resistor R1_N. The second end of each second resistor-switch group (a first contact of the two contacts of the single-pole double-throw switch) is grounded. A third end of each second resistor-switch group (a second contact of the two contacts of the single-pole double-throw switch) is coupled to the backward input terminal of the operational amplifier Amp.

In some embodiments of the present disclosure, the resistance values of each first resistor R1_1, . . . , R1_N are equal. The resistance values of each second resistor R2_1, . . . , R2_N−1, R2_N, R2_N+1 are equal. The resistance values of the second resistors R2_1, . . . , R2_N−1, R2_N, R2_N+1 are twice the resistance values of the first resistors R1_1, . . . , R1_N.

Figure 3A:
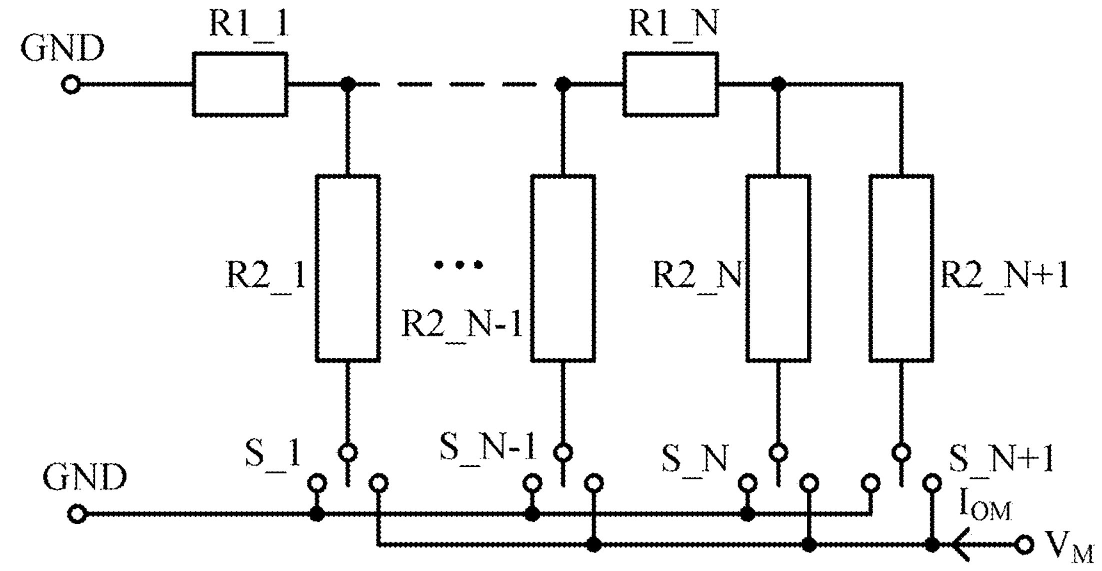
FIG. 3A and FIG. 3B are equivalent circuit diagrams of the sampling resistor network circuit as shown in FIG. 2.
Figure 3B:
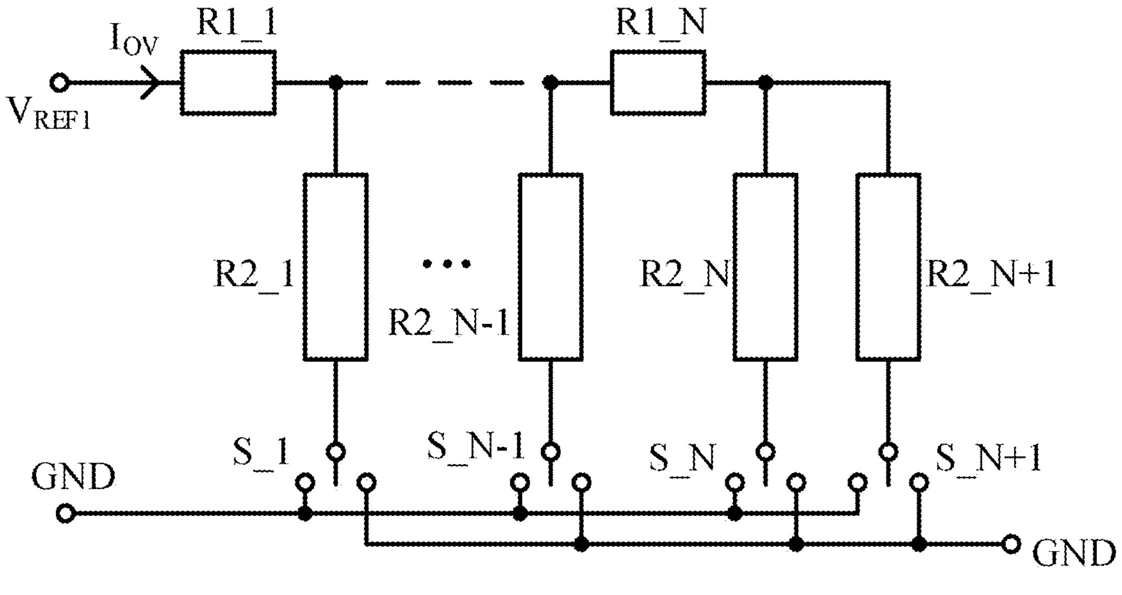

The output current IO is a result of two voltage components (the first reference voltage VREF1 and the voltage VM at the backward input terminal of the operational amplifier Amp) collectively acting on the sampling resistor network circuit 110. One part of IO is a current generated by the first reference voltage VREF1 acting on the sampling resistor network circuit 110, represented as IOV in the context. The other part of IO is a current generated by the voltage VM at the backward input terminal of the operational amplifier Amp acting on the sampling resistor network circuit 110 from another direction, represented as IOM in the context. IOM is caused by an offset voltage, and thus it can be referred to as offset current in context. The sampling resistor network circuit 110 (R-2R trapezoidal resistor network) can be regarded as a three-port linear circuit, with the three ports coupled to the ground GND, the first reference voltage VREF1, and the backward input terminal VM of the operational amplifier Amp respectively. The sampling resistor network circuit 110 controls the conduction states of N+1 single-pole double-throw switches S_1, . . . , S_N−1, S_N, S_N+1 based on different sampling codewords CODE1. N+1 single-pole double-throw switches S_1, . . . , S_N−1, S_N, S_N+1 can be coupled to the ground GND or the backward input terminal VM of the operational amplifier Amp in different states. FIG. 3A and FIG. 3B show the equivalent circuit diagrams of the sampling resistor network circuit 110 shown in FIG. 2. FIG. 3A shows the equivalent circuit for generating IOM. FIG. 3B shows the equivalent circuit for generating IOV.

Figure 4:
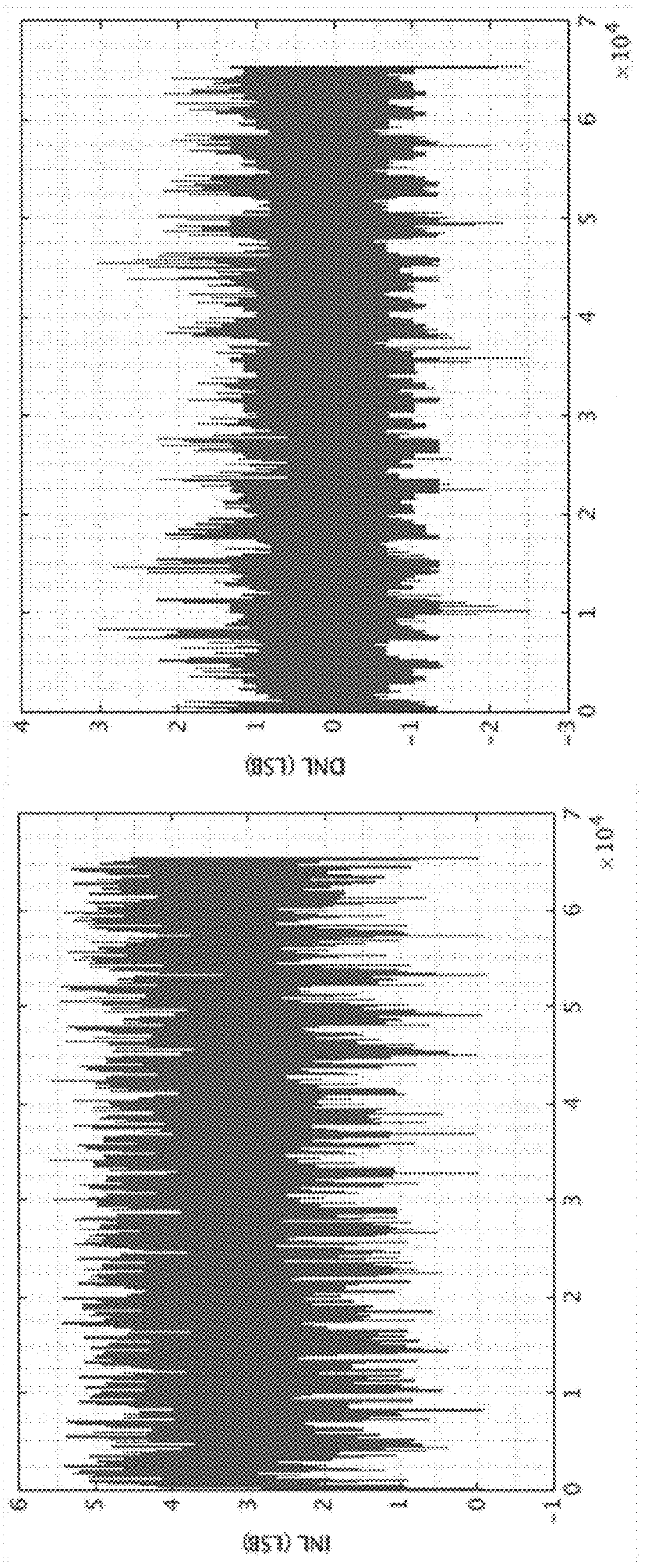
FIG. 4 shows measured values of differential nonlinearity (DNL) and integral nonlinearity (INL) of the digital-to-analog converter as shown in FIG. 1.

Both IOV and IOM will change with the variation of the sampling codeword CODE1. The variation of IOV is required by DAC, which can make the sampling voltage VOUT change linearly with the variation of the sampling codeword CODE1. IOM is not required by DAC, as it causes non-linear changes in the sampling voltage VOUT with the variation of the sampling codeword CODE1. The results of the integrated nonlinearity (INL) and differential nonlinearity (DNL) of the 16-bit DAC at VM=5 mV after considering IOM are shown in FIG. 4.

Figure 5:
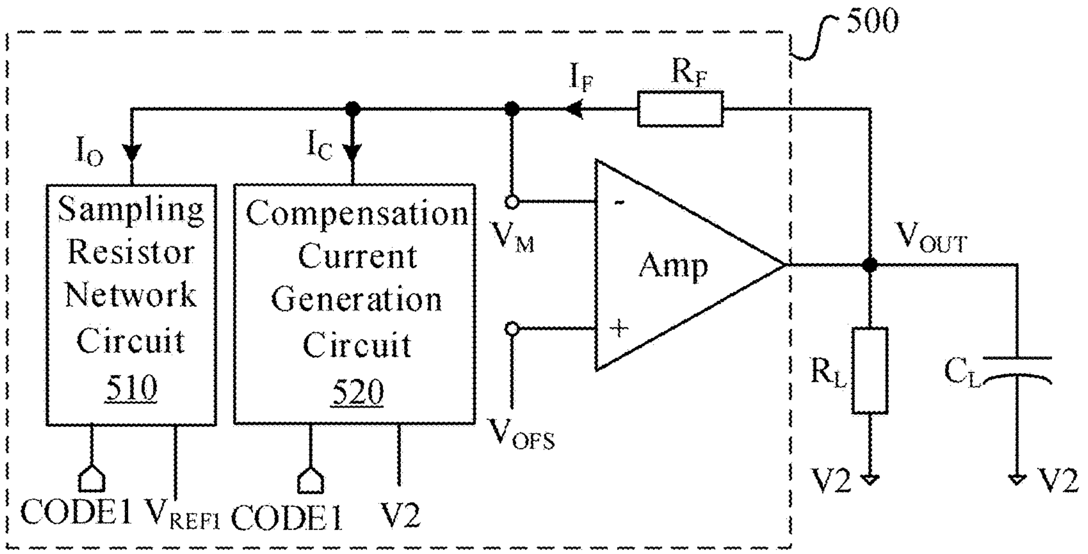
FIG. 5 is a schematic block diagram of a digital-to-analog converter according to an embodiment of the present disclosure.

FIG. 5 shows a schematic block diagram of the digital-to-analog converter 500 according to an embodiment of the present disclosure. The digital-to-analog converter 500 may include: a sampling resistor network circuit 510, an operational amplifier Amp, a feedback resistor RF, and a compensation current generation circuit 520.

The sampling resistor network circuit 510 is coupled between the first reference voltage terminal VREF1 and the first input terminal VM of the operational amplifier Amp. The sampling resistor network circuit 510 can be configured to control the sampling resistance value of the sampling resistor network circuit 510 based on the sampling codeword CODE1, and generate an output current IO based on a voltage difference between the first reference voltage VREF1 from the first reference voltage terminal VREF1 and the voltage VM at the first input terminal of the operational amplifier Amp as well as the sampling resistance value. The output current IO is equal to a result of the voltage difference between the first reference voltage VREF1 and the voltage VM divided by the sampling resistance value.

There is a voltage offset VOFS between the second and first input terminals of the operational amplifier Amp.

The first end of the feedback resistor RF is coupled to the first input terminal VM of the operational amplifier Amp. The second end of the feedback resistor RF is coupled to the output terminal of the operational amplifier Amp and the sampling voltage output terminal.

The compensation current generation circuit 520 is coupled between the second voltage terminal V2 and the first input terminal VM of the operational amplifier Amp. The compensation current generation circuit 520 is configured to generate a compensation current IC based on the sampling codeword CODE1. The compensation current IC is used to compensate for the offset current IOM generated by the offset voltage VOFS in the sampling resistor network circuit 510 in order to make a sum of the compensation current IC and the offset current IOM equal to the first constant. The first constant is independent of the sampling codeword CODE1. The sum of the compensation current IC and the output current IO is equal to the feedback current IF flowing through the feedback resistor RF. This is equivalent to converting the influence of VM into a constant current at the first input terminal of the operational amplifier Amp, and this constant current will be reflected on the sampling voltage VOUT in a form of a constant offset voltage. Compared to the non-linear error, the constant offset voltage is easier to be eliminated.

In some embodiments of the present disclosure, the first input terminal of the operational amplifier Amp is the inverting input terminal. The second input terminal of the operational amplifier Amp is the non-inverting input terminal. The sign of the first reference voltage VREF1 is opposite to the sampling voltage VOUT outputted from the sampling voltage output terminal.

Figure 6:
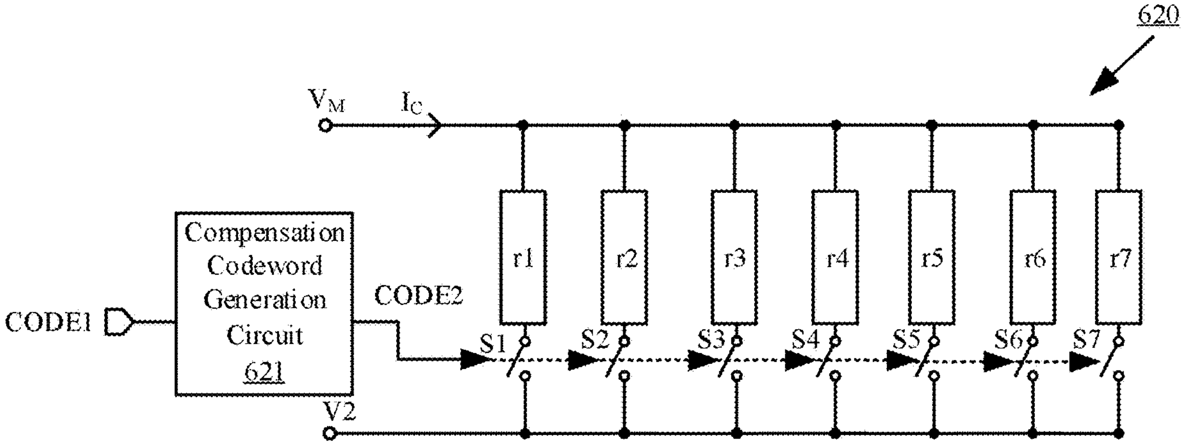
FIG. 6 is an exemplary circuit diagram of a compensation current generation circuit in the digital-to-analog converter as shown in FIG. 5.

FIG. 6 shows an exemplary circuit diagram of the compensation current generation circuit 520 in the digital-to-analog converter 500 shown in FIG. 5. In some embodiments of the present disclosure, the compensation current generation circuit 620 in FIG. 6 may include a compensation resistor network circuit. The compensation resistor network circuit can be configured to generate a compensation codeword CODE2 based on the sampling codeword CODE1, control the compensation resistance value of the compensation resistor network circuit based on the compensation codeword CODE2, and generate the compensation current IC based on the voltage difference between the voltage VM at the first input terminal of the operational amplifier Amp and the second voltage V2 from the second voltage terminal V2, as well as the compensation resistance value. In the example of FIG. 6, the second voltage terminal V2 is grounded.

In some embodiments of the present disclosure, as shown in FIG. 6, the compensation resistor network circuit may include: a compensation codeword generation circuit 621, K compensation resistors r1, . . . , r7, and K voltage-controlled switches S1, . . . , S7. In the example of FIG. 6, K=7. Those skills in the art should know that K can also be other integers greater than 1.

The compensation codeword generation circuit 621 may be configured to generate the compensation codeword CODE2 based on the sampling codeword CODE1. The compensation codeword CODE2 has K bits. Each bit of the compensation code CODE2 is used to control the controlled end of the corresponding voltage-controlled switch of the K voltage-controlled switches S1, . . . , S7. Each of the K voltage-controlled switches S1, . . . , S7 is connected in series with a corresponding compensation resistor of the K compensation resistors r1, . . . , r7 to form a resistor-switch group. The first end of each resistor-switch group (the first end (upper end) of the compensation resistor) is coupled to the first input terminal VM of the operational amplifier Amp. The second end of each resistor-switch group (the second end (lower end) of the voltage-controlled switch) is coupled to the second voltage terminal V2. The resistance values of K compensation resistors r1, . . . , and r7 are set as a geometric series. If the resistance value of the first compensation resistor r1 is r, then the resistance value of the second compensation resistor r2 is 2*r, the resistance value of the third compensation resistor r3 is 4*r, the resistance value of the fourth compensation resistor r4 is 8*r, the resistance value of the fifth compensation resistor r5 is 16*r, the resistance value of the sixth compensation resistor r6 is 32*r, and the resistance value of the seventh compensation resistor r7 is 64*r.

A sum of an equivalent conductance of the compensation resistor network circuit (the reciprocal of the equivalent resistance of the compensation resistor network circuit) and the equivalent conductance of the sampling resistor network circuit 510 (the reciprocal of the equivalent resistance of the sampling resistor network circuit 510) is equal to the second constant. In some embodiments of the present disclosure, the second constant is equal to an integer value rounded up by the equivalent conductance of the sampling resistor network circuit 510. For example, if the equivalent conductance of the sampling resistor network circuit 510 is equal to 9.45 Ω−1, then the second constant is equal to 10 Ω−1. In this way, the equivalent conductance of the compensation resistor network circuit has a small impact on the sampling accuracy of the digital-to-analog converter 500, and can also compensate for the nonlinear error voltage of the digital-to-analog converter 500.

Due to considerations of design cost, when implementing compensation resistor network circuits, it has to perform a certain degree of coarse quantization on the value of the equivalent conductance of the compensation resistor network circuit. The higher the accuracy of coarse quantization, the more ideal the improvement of linearity performance. In the example of FIG. 6, K=7 is a compromise between design cost and coarse quantization accuracy.

Those skills in the art should understand that any modifications made to the circuit shown in FIG. 6 based on the above invention concept should also fall within the protection scope of the present disclosure. In this variant, the aforementioned voltage-controlled switches, the compensation resistors, and the voltage terminals may also have different settings than the example shown in FIG. 6.

In an alternative embodiment of the example of FIG. 6, the compensation current generation circuit 520 includes a current source network circuit. The current source network circuit may be configured to generate the compensation codeword CODE2 based on the sampling codeword CODE1, and generate the compensation current IC based on the compensation codeword CODE2. The current source network circuit may include: the compensation codeword generation circuit, K compensation current sources, and K voltage-controlled switches. The compensation codeword generation circuit may be configured to generate the compensation codeword CODE2 based on the sampling codeword CODE1. The compensation codeword CODE2 has K bits. Each bit of the compensation code CODE2 is used to control the controlled end of the corresponding voltage-controlled switch of the K voltage-controlled switches. Each of the K voltage-controlled switches is connected in series with a corresponding compensation current source of the K compensation current sources to form a current source-switch group. The first end of each current source-switch group is coupled to the first input terminal VM of the operational amplifier Amp. The second end of each current source-switch group is coupled to the second voltage terminal V2. The values of the currents outputted from the K compensation current sources are set as a geometric series. K is an integer greater than 1. By controlling the compensation codeword CODE2, the value of the compensation current IC can be adjusted, such that the sum of the compensation current IC and the offset current IOM is equal to the first constant. In one example, K=7.

Figure 7:
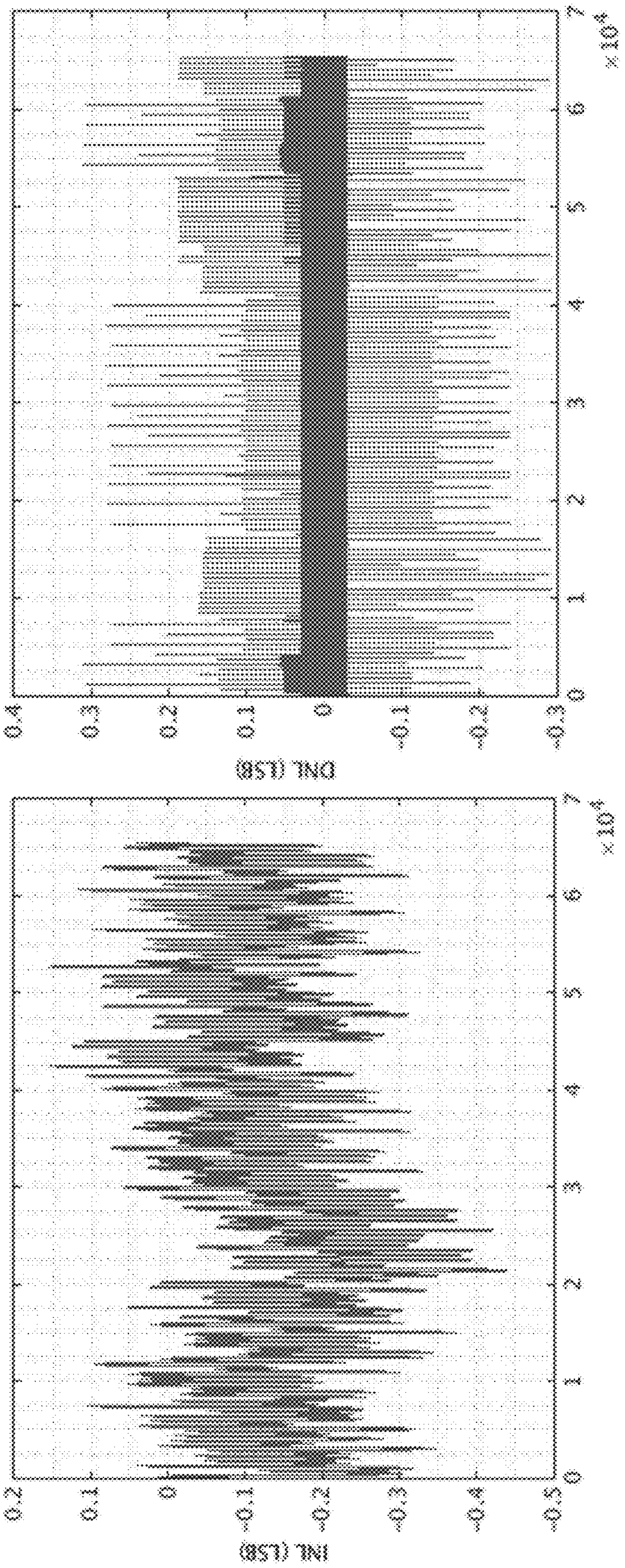
FIG. 7 shows measured values of differential nonlinearity (DNL) and integral nonlinearity (INL) of the digital-to-analog converter as shown in FIG. 5.

FIG. 7 shows the measured values of differential nonlinearity (DNL) and integral nonlinearity (INL) of the digital-to-analog converter 500 shown in FIG. 5. Compared to FIG. 4, it can be observed that the measured values of DNL and INL of the digital-to-analog converter 500 shown in FIG. 5 have significantly decreased.

Figure 8:
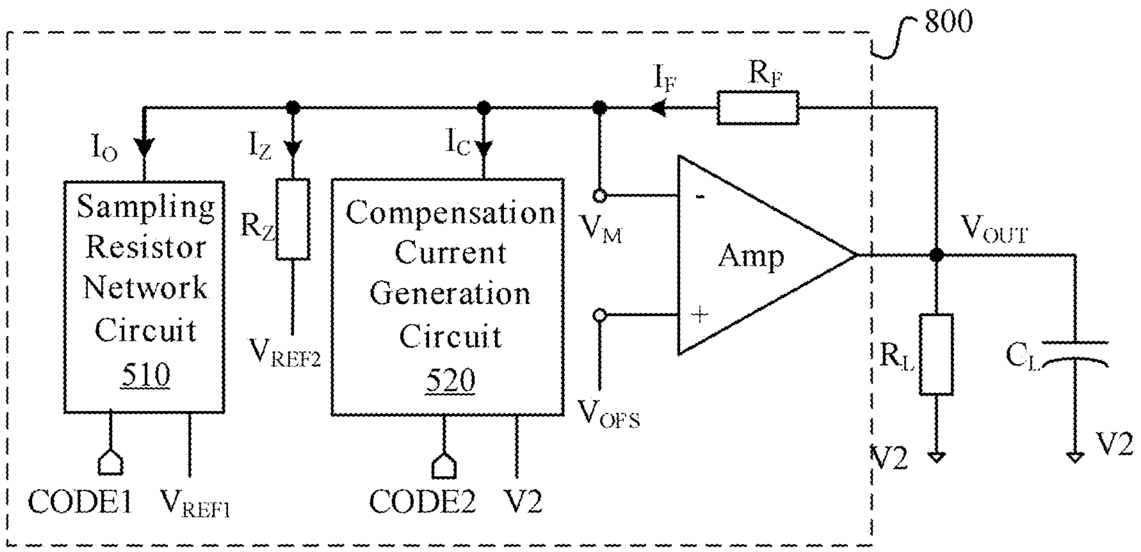
FIG. 8 is another schematic block diagram of the digital-to-analog converter according to an embodiment of the present disclosure.

FIG. 8 shows another schematic block diagram of the digital-to-analog converter 800 according to an embodiment of the present disclosure. On the basis of the digital-to-analog converter 500 shown in FIG. 5, the digital-to-analog converter 800 of FIG. 8 may further include a zero-adjusting resistor RZ. A first end of the zero-adjusting resistor RZ is coupled to the first input terminal VM of the operational amplifier Amp. The second end of the zero-adjusting resistor RZ is coupled to the second reference voltage terminal. The second reference voltage VREF2 outputted from the second reference voltage terminal is an inverted voltage of the first reference voltage VREF1. That is, VREF2=−VREF1.

The current flowing through the zero-adjusting resistor RZ can be referred to as the zero-adjusting current IZ in the context. A sum of the zero current IZ, the compensation current IC, and the output current IO is equal to the feedback current IF flowing through the feedback resistor RF. The zero-adjusting current IZ can be used to adjust the offset value of the sampling voltage VOUT (so that the range of sampling voltage VOUT values meets specific application requirements) and help to eliminate the constant offset voltage in the sampling voltage VOUT.

Figure 9:
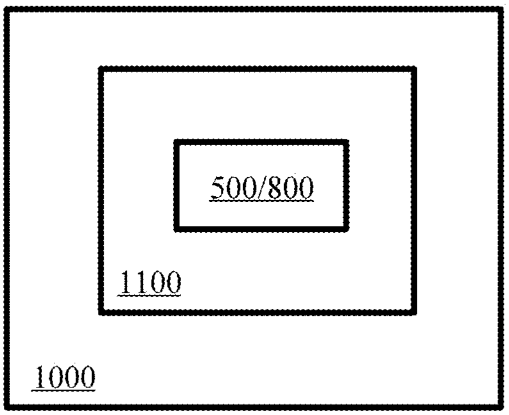
FIG. 9 is a schematic block diagram of an electronic device according to an embodiment of the present disclosure.

FIG. 9 shows a schematic block diagram of an electronic device 1000 according to an embodiment of the present disclosure. The electronic device includes a chip 1100 according to an embodiments of the present disclosure. The chip 1100 includes the digital-to-analog converter 500 as shown in FIG. 5 or the digital-to-analog converter 800 as shown in FIG. 8. The chip 1100 is used for high-precision digital-to-analog signal conversion, for example. The electronic device 1000 includes automatic testing equipment and industrial process control equipment.

In summary, the digital-to-analog converter according to the embodiments of the present application sets a compensation current generation circuit to fix the offset voltage of the operational amplifier, so as to alleviate the nonlinearity of the sampling voltage caused by the offset voltage. The digital-to-analog converter according to the embodiments of the present application is able to further reduce the fixed offset voltage of the sampling voltage by setting a zero-adjusting resistor.

As used herein and in the appended claims, the singular form of a word includes the plural, and vice versa, unless the context clearly dictates otherwise. Thus, singular words are generally inclusive of the plurals of the respective terms. Similarly, the words "include" and "comprise" are to be interpreted as inclusively rather than exclusively. Likewise, the terms "include" and "or" should be construed to be inclusive, unless such an interpretation is clearly prohibited from the context. Where used herein the term "examples," particularly when followed by a listing of terms is merely exemplary and illustrative, and should not be deemed to be exclusive or comprehensive.

Further adaptive aspects and scopes become apparent from the description provided herein. It should be understood that various aspects of the present disclosure may be implemented separately or in combination with one or more other aspects. It should also be understood that the description and specific embodiments in the present disclosure are intended to describe rather than limit the scope of the present disclosure.

A plurality of embodiments of the present disclosure has been described in detail above. However, apparently those skilled in the art may make various modifications and variations on the embodiments of the present disclosure without departing from the spirit and scope of the present disclosure. The scope of protecting of the present disclosure is limited by the appended claims.

What is claimed is:

1. A digital-to-analog converter comprising: a sampling resistor network circuit, an operational amplifier, a feedback resistor, and a compensation current generation circuit, wherein the sampling resistor network circuit is configured to control a sampling resistance value of the sampling resistor network circuit based on a sampling codeword, and generate an output current based on a voltage difference between a first reference voltage from a first reference voltage terminal and a voltage at a first input terminal of the operational amplifier as well as the sampling resistance value;

wherein a first end of the feedback resistor is coupled to the first input terminal of the operational amplifier, and a second end of the feedback resistor is coupled to an output terminal of the operational amplifier and a sampling voltage output terminal;

wherein the compensation current generation circuit is configured to generate a compensation current based on the sampling codeword; and wherein the compensation current is used to compensate for an offset current generated by an offset voltage in the sampling resistor network circuit in order to make a sum of the compensation current and the offset current equal to a first constant, wherein the first constant is independent of the sampling codeword, and wherein the offset voltage exists between a second input terminal of the operational amplifier and the first input terminal of the operational amplifier.

2. The digital-to-analog converter according to claim 1, wherein the compensation current generation circuit comprises a compensation resistor network circuit, wherein the compensation resistor network circuit is configured to generate a compensation codeword based on the sampling codeword, control a compensation resistance value of the compensation resistor network circuit based on the compensation codeword, and generate the compensation current based on a voltage difference between the voltage at the first input terminal of the operational amplifier and a second voltage from a second voltage terminal as well as the compensation resistance value.

3. The digital-to-analog converter according to claim 2, wherein the compensation resistor network circuit comprises: a compensation codeword generation circuit, K compensation resistors, and K voltage-controlled switches, wherein the compensation codeword generation circuit is configured to generate the compensation codeword based on the sampling codeword;

wherein the compensation codeword has K bits, and each bit of the compensation codeword is used to control a controlled terminal of a corresponding voltage-controlled switch of the K voltage-controlled switches;

wherein each of the K voltage-controlled switches is connected in series with a corresponding compensation resistor of the K compensation resistors to form a resistor-switch group, wherein a first end of each resistor-switch group is coupled to the first input terminal of the operational amplifier, and a second end of each resistor-switch group is coupled to the second voltage terminal;

wherein values of resistances of the K compensation resistors are set as a geometric series;

wherein a sum of an equivalent conductance of the compensation resistor network circuit and an equivalent conductance of the sampling resistor network circuit is equal to a second constant; and wherein K is an integer greater than 1.

4. The digital-to-analog converter according to claim 3, wherein the second constant is equal to an integer value rounded up from the equivalent conductance of the sampling resistor network circuit.

5. The digital-to-analog converter according to claim 4, wherein K=7.

6. The digital-to-analog converter according to claim 4, further comprising a zero-adjusting resistor, wherein a first end of the zero-adjusting resistor is coupled to the first input terminal of the operational amplifier, and a second end of the zero-adjusting resistor is coupled to a second reference voltage terminal; and wherein a second reference voltage outputted from the second reference voltage terminal is an inverted voltage of the first reference voltage.

7. The digital-to-analog converter according to claim 2, further comprising a zero-adjusting resistor, wherein a first end of the zero-adjusting resistor is coupled to the first input terminal of the operational amplifier, and a second end of the zero-adjusting resistor is coupled to a second reference voltage terminal; and wherein a second reference voltage outputted from the second reference voltage terminal is an inverted voltage of the first reference voltage.

8. The digital-to-analog converter according to claim 3, wherein K=7.

9. The digital-to-analog converter according to claim 3, further comprising a zero-adjusting resistor, wherein a first end of the zero-adjusting resistor is coupled to the first input terminal of the operational amplifier, and a second end of the zero-adjusting resistor is coupled to a second reference voltage terminal; and wherein a second reference voltage outputted from the second reference voltage terminal is an inverted voltage of the first reference voltage.

10. The digital-to-analog converter according to claim 1, wherein the compensation current generation circuit comprises a current source network circuit, wherein the current source network circuit is configured to generate a compensation codeword based on the sampling codeword, and generate the compensation current based on the compensation codeword.

11. The digital-to-analog converter according to claim 10, wherein the current source network circuit comprises a compensation codeword generation circuit, K compensation current sources, and K voltage-controlled switches, wherein the compensation codeword generation circuit is configured to generate the compensation codeword based on the sampling codeword;

wherein the compensation codeword has K bits, and each bit of the compensation codeword is used to control a controlled terminal of a corresponding voltage-controlled switch of the K voltage-controlled switches;

wherein each of the K voltage-controlled switches is connected in series with a corresponding compensation current source of the K compensation current sources to form a current source-switch group, wherein a first end of each current source-switch group is coupled to the first input terminal of the operational amplifier, and a second end of each current source-switch group is coupled to a second voltage terminal;

wherein values of currents outputted from the K compensation current sources are set as a geometric series; and wherein K is an integer greater than 1.

12. The digital-to-analog converter according to claim 11, wherein K=7.

13. The digital-to-analog converter according to claim 11, further comprising a zero-adjusting resistor, wherein a first end of the zero-adjusting resistor is coupled to the first input terminal of the operational amplifier, and a second end of the zero-adjusting resistor is coupled to a second reference voltage terminal; and wherein a second reference voltage outputted from the second reference voltage terminal is an inverted voltage of the first reference voltage.

14. The digital-to-analog converter according to claim 10, further comprising a zero-adjusting resistor, wherein a first end of the zero-adjusting resistor is coupled to the first input terminal of the operational amplifier, and a second end of the zero-adjusting resistor is coupled to a second reference voltage terminal; and wherein a second reference voltage outputted from the second reference voltage terminal is an inverted voltage of the first reference voltage.

15. The digital-to-analog converter according to claim 1, further comprising a zero-adjusting resistor, wherein a first end of the zero-adjusting resistor is coupled to the first input terminal of the operational amplifier, and a second end of the zero-adjusting resistor is coupled to a second reference voltage terminal; and wherein a second reference voltage outputted from the second reference voltage terminal is an inverted voltage of the first reference voltage.

16. The digital-to-analog converter according to claim 1, wherein the sampling codeword comprises N+1 bits, and the sampling resistor network circuit comprises: N first resistors, N+1 second resistors, and N+1 single-pole double-throw switches, wherein the N first resistors are sequentially connected in series, a first end of one of the N first resistors is coupled to the first reference voltage terminal, and a first end of any of the other first resistors is coupled to a second end of a previous first resistor;

wherein each second resistor of the N+1 second resistors and a corresponding single-pole double-throw switch of the N+1 single-pole double-throw switches form a second resistor-switch group, wherein a first end of each second resistor-switch group is coupled to a second end of a corresponding first resistor, a second end of each second resistor-switch group is grounded, and a third end of each second resistor-switch group is coupled to the first input terminal of the operational amplifier;

wherein conduction states of the N+1 single-pole double-throw switches are controlled by the sampling code-word; and wherein N is an integer greater than 1.

17. The digital-to-analog converter according to claim 16, wherein a resistance value of the second resistor is twice a resistance value of the first resistor.

18. The digital-to-analog converter according to claim 1, wherein the first input terminal of the operational amplifier is an inverting input terminal, the second input terminal of the operational amplifier is a non-inverting input terminal, and a sign of the first reference voltage is opposite to a sign of a sampling voltage outputted from the sampling voltage output terminal.

19. A chip comprising the digital-to-analog converter according to claim 1.

20. An electronic device comprising the chip according to claim 19.

* * * * *